United States Patent [19]

Fraas et al.

[11] Patent Number: 5,383,976
[45] Date of Patent: Jan. 24, 1995

[54] COMPACT DC/AC ELECTRIC POWER GENERATOR USING CONVECTIVE LIQUID COOLED LOW BANDGAP THERMOPHOTOVOLTAIC CELL STRINGS AND REGENERATIVE HYDROCARBON BURNER

[75] Inventors: Robert M. Fraas, Palm Desert, Calif.; Lewis M. Fraas; Jany X. Fraas, both of Issaquah, Wash.

[73] Assignee: JX Crystals, Inc., Issaquah, Wash.
[21] Appl. No.: 47,477
[22] Filed: Apr. 19, 1993

Related U.S. Application Data

[63] Continuation-in-part of Ser. No. 906,452, Jun. 30, 1992, Pat. No. 5,312,521.
[51] Int. Cl.$^6$ .......................................... H01L 31/058
[52] U.S. Cl. .................................. 136/253; 136/246; 431/100; 431/115
[58] Field of Search ................. 136/253, 246; 431/100, 431/115

[56] References Cited

U.S. PATENT DOCUMENTS

| | | | |
|---|---|---|---|
| 4,776,895 | 10/1988 | Goldstein | 136/253 |
| 4,976,606 | 12/1990 | Nelson | 431/79 |
| 5,091,018 | 2/1992 | Fraas et al. | 136/246 |
| 5,096,505 | 3/1992 | Fraas et al. | 136/246 |

OTHER PUBLICATIONS

A. P. Fraas, "Design and Development Tests of Direct-Condensing Potassium Radiators", USAEC Report Conf-651026 (U.S.A. 1965).
Kittl et al., "Design Analysis of TPV-Generator System", Proc. 25th Annual Power Sources Conf., pp. 106-110 (U.S.A. 1972).
Woolf, L. D., "Optimum Efficiency of Single and Multiple Bandgap Cells in Thermophotovoltaic Energy Conversion", Solar Cells, vol. 19, pp. 19-20 (USA 1986).
O'Neill et al., "Development of a Fresnel Lens Gallium . . . ", Phase I Final Report, NASA SBIR Contract No. NAS3-24871, Entech, Inc., (1986).
Fraas, "Heat Exchanger Design Operating on Radiant Energy", Wiley-Interscience Publication, pp. 365-382 (U.S.A. 1989).
Fraas, "Characteristics of Heat Sources", Engineering Evaluation of Energy Systems, pp. 96-125 (U.S.A. 1982).
Pelka, "Natural Gas-Fired Thermophotovoltaic System", Proceedings of the 32nd International Power Sources, pp. 110-123 (U.S.A. 1986).
Morgan et al., "Radioisotope Thermal Photovoltaic Application . . . ", NASA SPRAT Conference, pp. 349-358 (U.S.A. 1989).
Doellner, "Aircraft Photovoltaic Power-Generating System", PhD Thesis University of Arizona (U.S.A. 1991).
Fraas, "Effects of Directed and Kinetic Energy Weapons . . . ", Oak Ridge National Laboratory, pp. 1-76 (U.S.A. 1986).
Fraas et al., "Summary of the Research . . . ", Oak Ridge National Laboratories, pp. 1-33 (U.S.A. 1977).
Howe et al., "The Characteristics of Atmospheric-Type . . . ", Transactions of the A.S.M.E. pp. 673-677 (U.S.A. 1940).
Fraas, "Magneto-Hydrodynamic Systems", Engineering Evaluation of Energy Systems, pp. 437-461, (1982).
Day et al., "Application of the GaSb . . . ", Conference Record, pp. 1320-1325 (1990).

*Primary Examiner*—Aaron Weisstuch
*Attorney, Agent, or Firm*—James Creighton Wray

[57] ABSTRACT

Multiple low bandgap GaSb photovoltaic cell strings are mounted around the perimeter of a cylinder in parallel with the cylinder axis. These cell strings face radially inward and receive infrared (IR) radiation from a ceramic axial emitter and efficiently convert this radiation into DC electric power. Linear reflectors are associated with each cell string and serve to concentrate IR energy into the photovoltaic cells or to return it to the emitter. The ceramic emitter is heated from the inside by hydrocarbon combustion. A uniform temperature along the length of the emitter is maintained by staged addition of fuel in a special burner design. Regenerative air heating is also inherent in the burner design increasing its efficiency. Air for the combustion is supplied by a blower. Sliding contacts to the rotating shaft on the blower can be used for DC to AC conversion. The cell strings are cooled through a compact closed cycle convective liquid cooling loop. The resultant unit is a compact, quiet, light weight DC or AC electric power source.

9 Claims, 3 Drawing Sheets

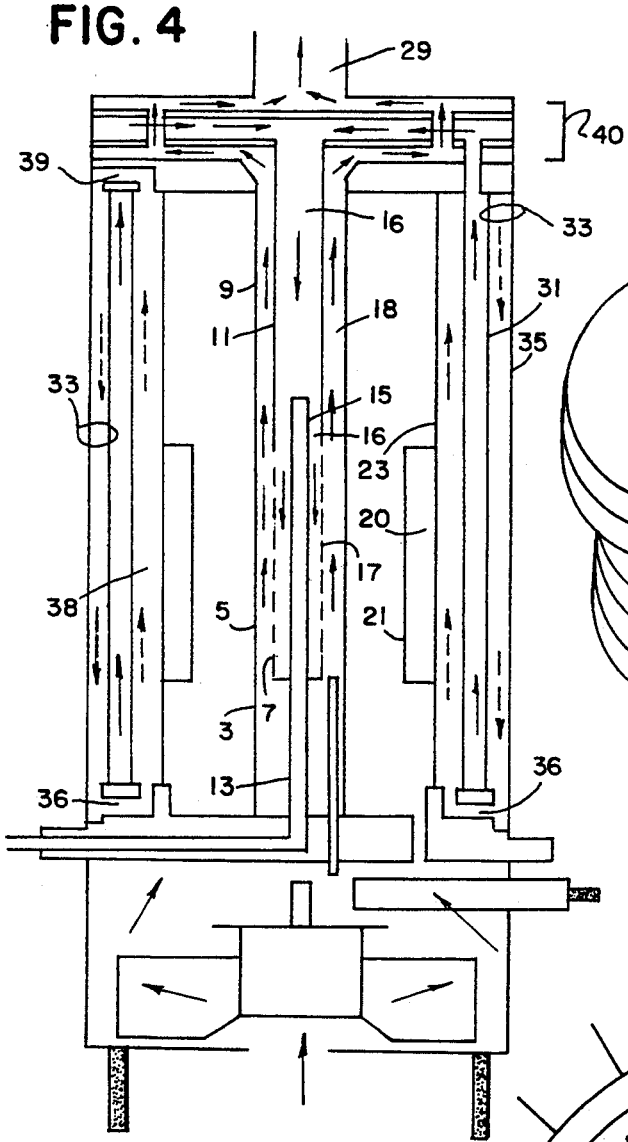

COMPACT DC/AC ELECTRIC POWER GENERATOR USING CONVECTIVE LIQUID COOLED LOW BANDGAP THERMOPHOTOVOLTAIC CELL STRINGS AND REGENERATIVE HYDROCARBON BURNER

CROSS REFERENCE TO RELATED APPLICATION

This application is a continuation-in-part of U.S. patent application Ser. No. 07/906,452, filed Jun. 30, 1992, now U.S. Pat. No. 5,312,521, which earlier application is incorporated herein by reference.

BACKGROUND OF THE INVENTION

Various attempts to fabricate practical and economical thermophotovoltaic (TPV) power generators have been reported over the years. In 1986, D.O.Pelka, A. Santos and W.W. Yuen described earlier efforts and their attempt to design and fabricate a natural gas-fired thermophotovoltaic system. Their desk top sized unit used a rotating drum with a porous particle bed serving as the high temperature emitter operating at >2000° K. Silicon TPV cells were mounted inside the rotating drum. They noted that for silicon cells and an emitter temperature <2600° K., over 76% of the black body radiation is in unusable long wavelength (>1.1 microns) energy. Their design was complicated by their attempt to design a very high temperature emitter as required by the silicon TPV cells. Without very high temperature emitters, TPV systems based on silicon cells are both inefficient and operate at low power densities. Selective emitters based on rare earth oxides have been described (see U.S. Pat. No. 4,976,606) which improve efficiencies but still suffer from low power densities at practical emitter temperature. Low power density units are not economical for large volume energy production.

In 1989, L.M.Fraas et. al. described a new GaSb photovoltaic cell sensitive in the IR out to 1.8 microns. This cell was designed to be used with concentrated sunlight as an infrared booster cell in tandem with GaAs solar cells (see U.S. Pat. No. 5,096,505). In 1989, M.D.Morgan, W.E.Horne, and A.C.Day (NASA SPRAT conference) proposed using GaSb cells in combination with a radioisotope thermal generator for space electric power and in 1991, O.L.Doellner proposed using GaSb cells looking at jet engine plumes to replace alternators on jet aircraft. As of this writing (April 1993), neither Morgan nor Doellner have built a TPV generator using GaSb cells.

It now seems timely to take a fresh approach to the design of a compact natural gas-fired TPV generator. It is clear that the longer wavelength response of the GaSb cell will allow the use of lower temperature emitters. However, several problems must still be solved. First, when photovoltaic cells are wired together in series in order to generate a required voltage, eg. 12 V, it is important that they each receive the same amount of IR radiation. Otherwise, the cell string current is limited by the cell with the lowest IR generated current. This translates to a requirement to tailor the temperature profile over a large region of the emitter surface. Second, energy conversion efficiency is not only controlled by the TPV cell bandgap and response to the IR; exhaust gas heat losses up the stack can be appreciable without providing for regenerative heating of the supply air by the exhaust gas. This will also increase the flame temperature and permit higher emitter temperatures, which will in turn increase the cell output per unit of cell area, and thus reduce the size, weight, and cost. Third, the low bandgap TPV cell temperature must be maintained near room temperature in order to preserve high cell conversion efficiency. Forth, the IR energy from the emitter has to be efficiently coupled to the TPV cell strings. And finally, fifth, it may be desirable to tune the low bandgap response even somewhat further into the infrared.

SUMMARY OF THE INVENTION

The present invention relates to thermophotovoltaics and more particularly to the use of new low bandgap GaSb or $Ga_{1-x}In_xSb$ photovoltaic cells sensitive to IR radiation down to 2.0 microns. These new cells allow the use of lower temperature (eg. 1800° K.) ceramic thermal emitters. Previous silicon cells required the operation of man-made IR emitters at impracticably high temperatures where materials problems severely limited emitter lifetimes. These new low bandgap cells are wired in series strings and combined with a novel burner/emitter designed with provision for uniform temperature along its length in order to maximize cell string current and power output. The cell strings and burner/emitter are integrated together with IR reflectors to form a compact, quiet, light weight, and clean burning DC electric power supply which can be used for off grid electric power for recreational vehicles, mountain cabins, or third world village homes. In colder climates, the unit can be used for heating as well as electric power. One version of the unit is cylindrical in shape with a diameter of 5" to 10" and a height of 18" to 24". Depending on the number of cell strings provided with this unit, it is designed to generate from 300 W to 1 kW. Larger units producing 3 kW to 7 kW can be used as power systems in electric vehicles where they would run cleaner than an internal combustion engine and serve to reduce battery size and weight in today's electric vehicles.

In the present invention, multiple low bandgap GaSb photovoltaic cell strings are mounted around the perimeter of a cylinder in parallel with the cylinder axis. These cell strings face radially inward and receive infrared (IR) radiation from a ceramic axial emitter and efficiently convert this radiation into DC electric power. Linear reflectors are associated with each cell string and serve to concentrate IR energy into the photovoltaic cells or to return it to the emitter. The ceramic emitter is heated from the inside by hydrocarbon combustion. A uniform temperature along the length of the emitter is maintained by staged addition of fuel in a special burner design. Regenerative air heating is also inherent in the burner design increasing its efficiency. Air for the combustion is supplied by a blower. Sliding contacts to the rotating shaft on the blower can be used for DC to AC conversion. The cell strings are cooled through a compact closed cycle convective liquid cooling loop. The resultant unit is a compact, quiet, light weight DC or AC electric power source.

A major feature of the present invention resides in the burner/emitter/regenerator design. The emitter will consist of a long ceramic tube surrounding and coaxial with a central burner tube. Note that a simple blowtorch-type of burner would not give the nearly uniform axial and circumferential emitter surface temperature distribution required. Instead, the burner design chosen employs a multiplicity of small flames similar to those in the gas burners of a kitchen stove. The preferred embodiment of our burner/emitter/regenerator contains three coaxial tubes, an outer emitter tube, an intermediate diameter burner tube, and a fuel injector tube inside the burner tube. In our design, hydrocarbon combustion gas is injected from the bottom into the center of the burner tube through a smaller diameter fuel injector tube coaxial with the emitter tube. The fuel injection tube is closed at the top and has a hole pattern near its top where fuel is injected radially and uniformly mixed with already heated combustion air travelling downward along the length of the burner tube. The burner tube air has been fed downward through the regenerator where the air had been preheated. The downward traveling fuel/air mixture then jets radially outward from small ports in the burner tube wall to form a pattern of small flames in the annulus between the burner tube and the inner wall of the emitter. The hole pattern in the burner tube can be tailored to achieve a given desired temperature profile along the length of the emitter tube. The flames heat the emitter to provide the IR energy radiated to the TPV cells. Energy transfer to the emitter from the flames can be enhanced by providing fins on the inner surface of the emitter. The flame by-products or exhaust gases then pass upward in the annular space between the emitter and the burner tube transferring heat to the supply air inside the upper end of the burner tube. This heat transfer process can be enhanced by providing fins on the outer surface of the upper section of the burner tube.

A further feature of this invention is to locate the TPV cell strings in parallel with the emitter tube pointing radially inward at the emitter. Reflectors are associated with the cell strings designed to concentrate the IR energy into the cell strings or to return the IR energy to the emitter.

Another feature of the invention resides in the design of the TPV cell string for near room temperature operation. The cell string is mounted on a heat sink allowing for back-side liquid cooling. Liquid cooling is accomplished by a closed circuit convective loop where the cell waste heat provides the energy to circulate the liquid and no external liquid supply lines are required. A multipane glass window is located in front of the cell string to minimize conduction heating by the hot air coming from the emitter. The front of the glass window is optically coated to reflect long wavelength IR (>2 microns) but to transmit short wavelength IR.

Still another feature of this invention is the use of a blower to provide forced air supply to the burner. Forced air supply allows for smaller diameter air supply tubes and a more compact emitter. The rotating shaft of the blower can also be used to convert from DC to AC currents if desired.

Yet another feature is the possible use of $Ga_{1-x}In_xSb$ instead of GaSb TPV cells with their associated longer wavelength response.

These and other features of the invention will become more fully apparent from the claims, and from the description as it proceeds in conjunction with appended drawings.

BRIEF DESCRIPTION OF THE DRAWINGS

FIG. 4 shows a vertical cross section through a preferred embodiment of our TPV generator.

FIG. 5 shows a horizontal cross section through the preferred embodiment of our TPV generator.

FIG. 7 shows a multi-stage (three stages actually shown) secondary regenerator which could be located at the top end of our TPV generator.

Finally, FIG. 8 shows a standard means of converting DC current to AC current using sliding contacts to rings on the blower shaft.

DETAILED DESCRIPTION OF PREFERRED EMBODIMENTS

Figure 1:
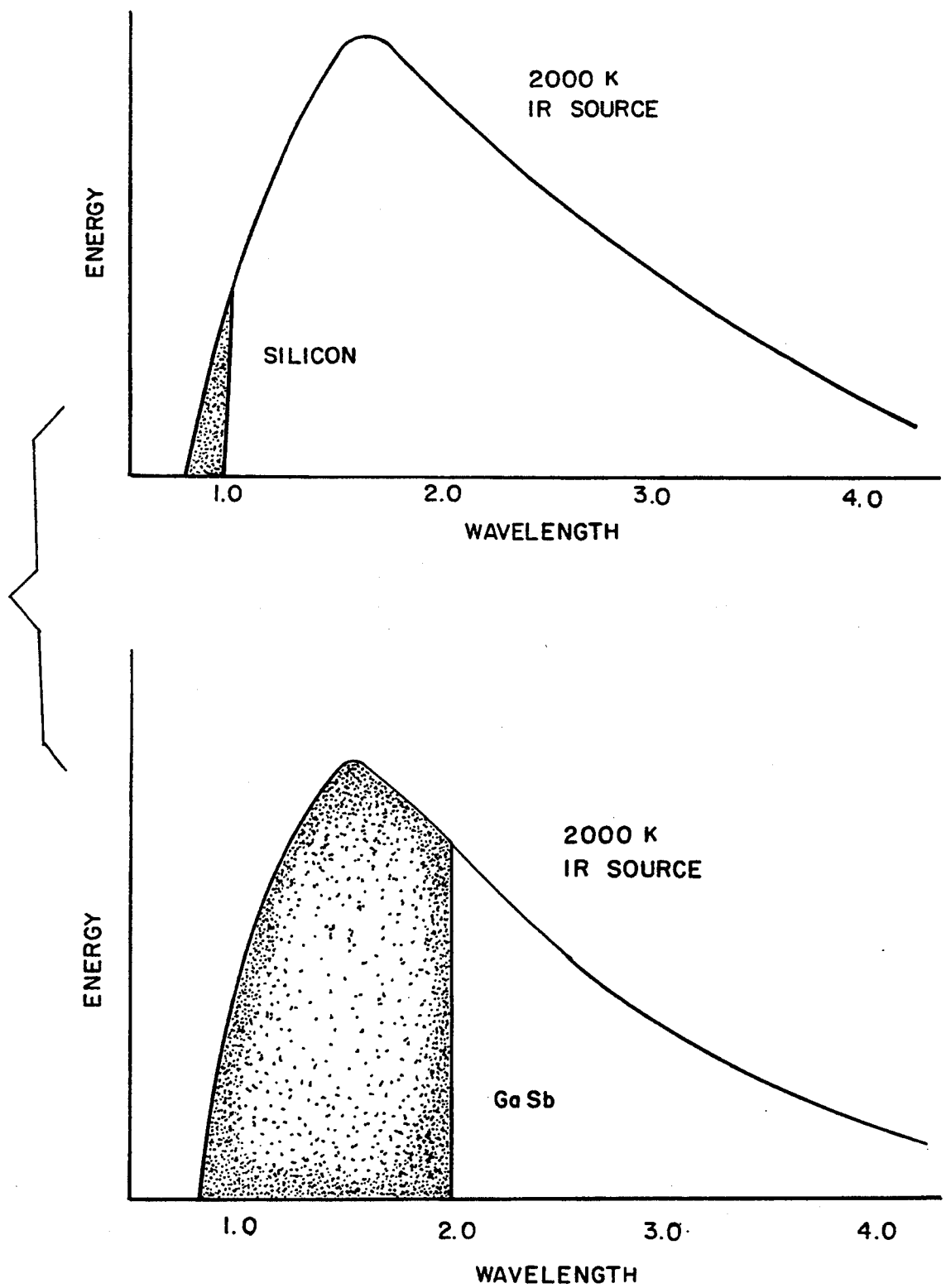
FIG. 1 shows the radiated infrared power as a function of wavelength for black body emitter at 2000° K.

FIG. 1 shows the radiated infrared power as a function of wavelength for a black body emitter at 2000° K. As noted, silicon weakly absorbs energy for wavelengths below 1.1 microns while GaSb strongly absorbs energy for wavelengths below 1.8 microns.

Figure 2:
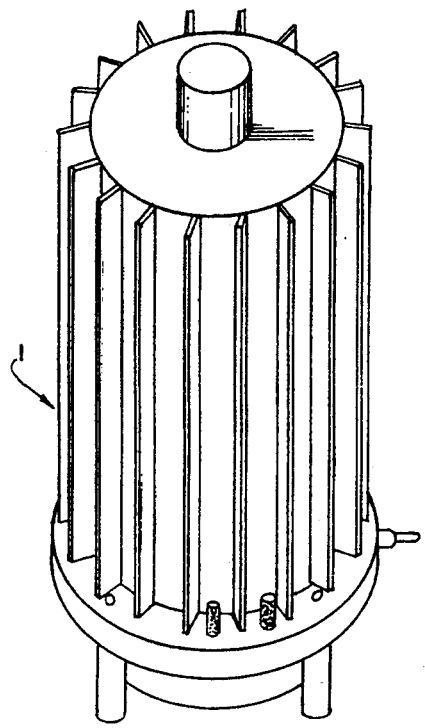
FIG. 2 shows the quiet compact DC electric power generator described in detail herein.

FIG. 2 shows the quiet compact DC electric power generator described in detail herein. The unit is cylindrical. Hydrocarbon fuel and air are supplied at the bottom to provide radiant energy which is converted to DC electric power using photovoltaic cells. Exhaust gases exit the top. This unit is about 8" in diameter and 18" high.

Figure 3:
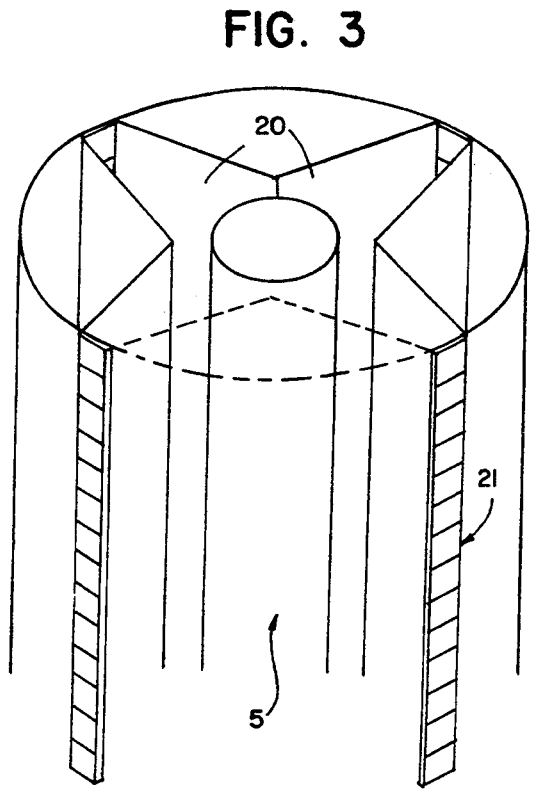
FIG. 3 shows conceptually the inside view of the key elements of the unit FIG. 2.

FIG. 3 shows conceptually the inside view of the key elements of the unit in FIG. 2. The fuel and air are burned inside a vertical emitter tube located at the center of the cylinder. IR energy radiated by this emitter is absorbed by the GaSb TPV cell strings and converted to electric power.

FIG. 4 shows a vertical cross section through a preferred embodiment of our TPV generator. Fuel is supplied to the center of the burner tube through a small fuel injector tube with radial holes at its top. Air is supplied from the bottom by a blower. Air first passes upward through the region behind the cell strings, then it travels radially inward in a secondary regenerator to the top of the burner tube where it then flows downward throught a primary regenerator. In both the primary and secondary regenerators, the air is heated by proximity with the exhaust gases. Heated air arriving at the top of the fuel injector tube then mixes with the fuel and continues to flow downward. Jets of fuel/air mixture escape the burner tube through an array of holes distributed along the lower length of the burner tube. These jets then ignite into flames in the region between the burner tube and the emitter tube making the emitter glow with IR radiant energy. Exhaust gases then pass upward heating the supply air in primary and secondary regenerators before escaping at the top of the generator.

Dotted arrows in this figure also show the liquid coolant convective loop. The cell strings are mounted on channel containing liquid coolant. Waste heat from the cells heats the liquid which then rises through the channels to the top where it flows outward to a cylindrical coolant jacket at the outer surface of our generator. Vertical fins on the outer surface are cooled by room air and thereby cool the liquid which then flows downward and back into the channels behind the cells completing the convective cooling loop.

FIG. 5 shows a horizontal cross section through the preferred embodiment of our TPV generator. Starting from the center and moving outward, the smallest tube is the fuel injector tube 13. The dashed circle is then the burner tube 7 with jet ports. Flames (not shown) heat the emitter tube 5 which is the next circle out. IR radiation then passes through a quartz tube 23 which serves to limit heat tranfer to the cell strings 21 by the air in the space between the emitter and the cells. This quartz tube can be coated with a coating that reflects IR with wavelengths longer than 2 microns back to the emitter while allowing wavelengths less than 2 microns to pass on to the concentrator funnels 22 located on each cell string 21. The cells at the base of each concentrator are mounted on coolant channels 38. The two largest circles enclose the coolant jacket 33. Fins 34 on the outside of this coolant jacket efficiently pass the heat on to the external air.

FIG. 6 shows three dimensional views of two alternative TPV cell string assemblies. In both configurations, rectangular cells are series connected into a line receiver. The cells are bonded to one outer face of a cooling channel. The bond is thermally conducting but electrically insulating. In the first configuration, IR is funneled or concentrated at the cell string by reflecting sheet metal mirrors located on either side of the cell string. In the second configuration, a solid glass element is directly bonded to the top of each cell. In this configuration, IR concentration occurs by total internal reflection inside this optical element.

FIG. 7 shows a multi-stage (three stages actually shown) secondary regenerator which could be located at the top end of our TPV generator. In this drawing, air is supplied to the top stage from the blower through outer vertical tubes. The air then travels radially inward between two metal plates, the plates being heated by exhaust gases passing radially in channels above and below. The air then passes down traversing the lower exhaust channel into another air channel where it passes radially outward in a second heat transfer stage. At the outer end of the channel, air then passes downward and radially inward one more time (third stage) before entering the primary regenerator at the upper end of the burner tube. Exhaust gases enter at the bottom inside and pass first radially outward, up, then radially inward, up, radially outward, up, and finally radially inward and out the top end. Through this process, the exhaust gases heat the air in the intermediate air channels. FIG. 4 actually shows a single stage secondary regenerator 40 at the top of our TPV generator. In our terminology, the primary regenerator is closest to, the burner and hotter, while the secondary regenerator is further away, more vertically compact, and can be fabricated using metal discs.

Finally, FIG. 8 shows a standard means of convening DC current to AC current using sliding contacts to rings on the blower shaft thereby taking advantage of the blower for another useful purpose if desirable.

FIG. 1 provides information for choosing TPV cell and IR radiator materials. Referring to FIG. 1, the radiation energy from a black body at 2000° K. (1727° C.) peaks at about 1.45 microns. This means that silicon with an indirect band gap of 1.1 microns absorbs very little IR radiation from this source while GaSb and $Ga_{0.9}In_{0.1}Sb$ with direct bandgaps at 1.8 and 2.0 microns, respectively, absorb much more of the IR energy.

The emitter could be made of an iron-nickel-cobalt alloy, but corrosion and strength considerations would limit its peak operating temperature to about 1300° K. Ceramic emitters will permit operation at higher temperatures which will give much higher radiation energy fluxes and greatly increase the output ot the photovoltaic cells, thus reducing their cost per unit of electrical output. High temperature ceramic tubing is available in alumina, mullite, and silicon carbide and, therefore, these materials are candidates for IR emitter tubing. The highest recommended static operating temperature for alumina and mullite is 2000° K., but these materials have low emissivity. However, we have solved this low emissivity problem by applying a coating of another ceramic with a high emissivity over the mullite or alumina tube. Silicon carbide is also an excellent emitter material since it has a higher emissivity, thermal conductivity, and thermal shock resistance than alumina or mullite. Still, a more conservative temperature for long operating lifetime might be 1800° K. in which case $Ga_{0.9}In_{0.1}Sb$ becomes the preferred TPV material.

FIG. 2 shows a TPV generator 1 from the user's point of view. This unit is designed to be a small, quiet, lightweight electric power supply for a remote mountain cabin in the pacific northwestern U.S. As such, it is designed to run off propane, butane, or natural gas and to provide electric power for a refrigerator, evening light, and color TV. We have determined that this translates to 50 watts for the refrigerator (Model DC 254 Norcold), 50 watts for the light, and 70 watts for the TV (13" Panasonic Color AC/DC) or 170 watts total. Given this information, we have decided to design a 300 watt basic unit. As will be evident later, this power output is easily increased simply by increasing the number of cell strings or the cell string width.

FIGS. 4 and 5 show detailed cross sections through the TPV generator 1. A burner/emitter/regenerator is located at the center of the unit along the vertical cylinder axis. Referring to FIG. 4, the lower end of a silicon carbide outer tube 3 (approximately 1.7" in OD and 15" long) forms the IR emitter 5 and encloses the burner 7 while the upper end 9 of the same tube encloses the primary regenerator 11. Fuel is injected from the bottom end into a smaller closed end fuel injector tube 13 (approximately 0.25" OD and 8" long). Holes 15 at the top of the fuel tube inject fuel into the air streams 16. The fuel/air mixture then jets out as flames through holes 17 along the length of the burner tube 7. The hole pattern 17 is drilled into the sides of this burner tube and is tailored for an optimal temperature profile along the length of the emitter tube 5. Air is injected at the top of the primary regenerator 11 and flows directly into the burner tube 7. As the supply air passes downward in the upper section or primary regenerator section, it is heated by the rising hot exhaust gases 18. Hence the upper section of the silicon carbide tube becomes the primary regenerator. After the hot air mixes with the fuel and burns, the resultant flames heat the silicon carbide emitter tube to the 1800° K. design value. At this temperature, the emitter radiates 60 watts of IR power per $cm^2$ of emitter area.

Referring to FIG. 3, the emitter is surrounded by reflector panels 20 and the TPV cell strings 21 are mounted in the small gaps between reflectors. For perfect reflectors, this situation can be modeled as a black body cavity where the cells are looking in at radiation from an 1800° K. source. In this case, the IR power arriving at the cell surface is 60 watts per $cm^2$ of cell area. For a GaSb cell, 17 watts/$cm^2$ will be absorbed and 43 watts/$cm^2$ will be reflected back to the radiator. Of the 17 watts/$cm^2$ absorbed, 6.6 watts/$cm^2$ is converted to electricity for an ideal conversion efficiency of 39%. For a perfect reflector, the shape of the reflector is not important. However, for practical reflectors, it will help to shape the reflectors to concentrate the IR energy to the cells with as few reflections as possible.

Besides the efficiency loss in the cell, there will also be heat losses up the stack 29 (FIG. 4) and heat losses through air to the cylinder walls 31 (FIGS. 4 & 5). These losses will be reduced by using a longer primary regenerator 11 or primary 11 and secondary 40 regenerators (FIG. 4).

Referring to FIGS. 4 & 5, the TPV generator cylinder 33 actually consist of two concentric cylindrical shells 31 and 35 forming a liquid coolant jacket. The space between the two sylinders is filled with cooling liquid used in a convective loop to cool the cell strings. Fins 34 on the outer cylinder 35 remove heat from the liquid so that the liquid flows downward in the generator cylinder coolant jacket 33 passing through holes in the generator coolant base plate 36. The cell strings are mounted on square cross section liquid filled cooling channels 38 which form the upward flow section of the convective cooling loop. Holes in the top coolant plate 39 complete the compact closed circuit convective loop. This convective loop serves both to efficiently cool the TPV cells and to prevent the outer cylinder walls from getting hot to the touch for safety purposes.

Figures 6A, 6B:
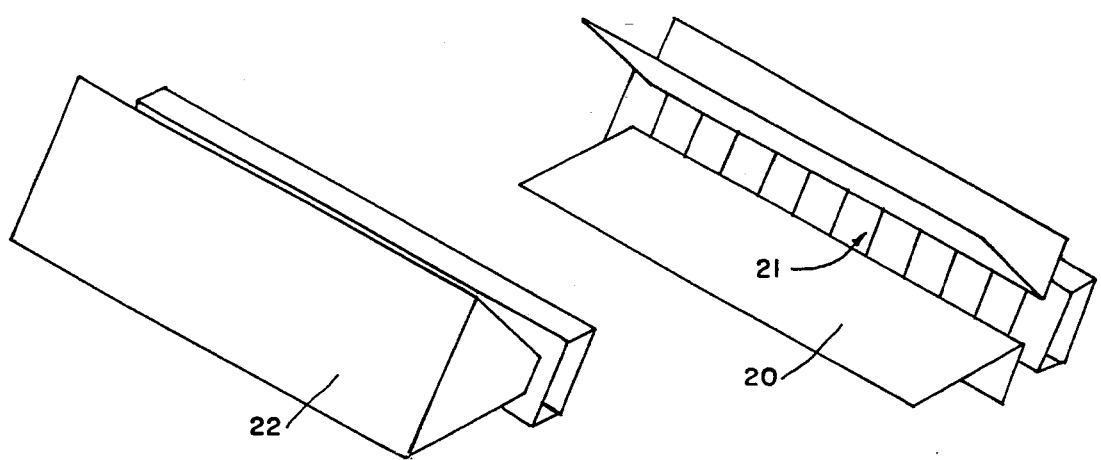
FIG. 6 shows three dimensional views of two alternative TPV cell string assemblies.

FIG. 6 shows two exemplary designs for a GaSb TPV cell string. FIG. 6a shows cells with reflecting panels 20 serving to concentrate the IR radiation into the cells whereas FIG. 6b shows a solid optical element 22 fabricated from glass where IR energy is concentrated to the cells by total internal reflection. Imagine that the FIG. 6a units are used in a lower voltage DC generator as depicted in FIG. 3 and the FIG. 6b units are used in a higher voltage DC or AC unit as depicted in FIG. 5.

For the lower voltage unit, the GaSb cells might be 1 cm wide and 0.4 cm long. For a radiator at 1800° K., each cell produces 2.2 watts. A cell string 8" long will contain 33 cells and will produce 75 watts at 14 volts and approximately 5.3 amps. The TPV generator unit represented in FIG. 3 has 4 cell strings which will generate 300 watts. These cell strings can be wired to generate 12, 24, or 48 volts. Batteries are provided to operate the blower during start-up. The blower will consume approximately 5 watts.

For the higher voltage unit, the cells might be 0.5 cm wide by 0.4 cm long. For a emitter at 1800° K., each cell then produces 1.1 watts. A cell string 4" long will contain 16 cells and will produce 18 watts at 6 volts and approximately 2.7 amps. The TPV generator unit represented in FIG. 5 has 20 series connected cell strings generating 360 watts at 120 volts. The dimensions and operating parameters cited herein are intended only to be exemplary.

FIG. 7 shows our secondary regenerator 40 design in more detail. It consists of a set of 2N+2 thin metal discs 41 sandwiched together creating 2N+1 radial channels 42 and 43. Air (A) and exhaust (E) flow in alternate channels so that there are N+1 exhaust channels 42 and N air channels 43. An array of tubular elements 44 connect the air channels and traverse the exhaust channels. Similarly, an array of tubular elements 45 connect the exhaust channels and traverse the air channels so that the air and exhaust do not mix. The tubular elements 44 and 45 are arranged so that air and exhaust flow alternately radially inward and outward. Heat is passed from the exhaust to the air through the heat exchanger discs 41. For the FIG. 7 secondary regenerator, N=3. Thus, air enters at the outside top and moves radially inward in a first channel being heated by exhaust in channels above and below, then down through a tubular array and radially outward in a second air channel, and finally down and radially inward in the third air channel to the top of the primary regenerator and burner. Secondary regenerators of this type have the following advantagews. They are easy and inexpensive to make, efficient, and vertically compact. They are cylindrically symmetric and designed specifically for our TPV generator.

Various changes and alterations may be made without parting from the spirit of the invention disclosed herein. All changes and modifications which fall within the scope of the claims and equivalents thereof are intended to be embraced thereby.

We claim:

1. A thermophotovoltaic generator comprising: a central coaxial burner/emitter/regenerator at least partially surrounded by linear parallel thermophotovoltaic cell strings facing the burner/emitter for converting infrared energy received from the burner/emitter to DC or AC electric power wherein:

a) energy for the burner/emitter/regenerator comes from combustion of a hydrocarbon fuel and air mixture, b) the regenerator preheats incoming combustion air with outgoing exhaust gases thereby increasing efficiency in utilization of energy from the fuel and providing for a greatly increased flame temperature and burner/emitter temperature thereby increasing infrared flux to the thermophotovoltaic cell strings, increasing electrical power output of a given size cell string and reducing cost per watt of cell string electrical output relative to a thermophotovoltaic generator without said regenerator, c) the cell strings are responsive to infrared radiation with wavelengths at least as long as 1.7 microns, and d) optical elements are provided totally surrounding the emitter/burner except for spaces occupied by the thermophotovoltaic cell strings, for directing the infrared radiation emanating radially from the burner/emitter and for concentrating most of the infrared radiation on the cell strings, e) the burner/emitter/regenerator and the optical elements combining for providing uniform infrared energy input along a length of each photovoltaic cell string.

2. The thermophotovoltaic (TPV) generator of claim 1 where said cell strings further comprise $Ga_{1-x}In_xSb$ photovoltaic cells wherein x is any value between 0 and 0.2.

3. The TPV generator of claim 1 further comprising a blower for supplying forced air to said burner/emitter/regenerator.

4. The generator of claim 3 wherein said blower comprises a shaft with split rings and sliding contacts for the purpose of converting the DC current generated by the photovoltaic cells to AC current.

5. The generator of claim 1 further comprising a coaxial secondary regenerator above the burner comprising 2N+2 metal discs sandwiched together creating 2N+1 circular channels, said channels allowing alternately air and exhaust gas radial flow in N+1 exhaust channels and N air channels, said metal discs being separated by arrays of tubular elements coupling air channel to air channel traversing one exhaust channel or coupling exhaust channel to exhaust channel traversing one air channel in such a way that the air and exhaust gases do not mix, said channels and tubular elements forcing air and exhaust gases to flow radially inward and outward several times, for heating the air during each pass by the exhaust gases from above and below through the metal disc which serve as heat exchanger elements.

6. The generator of claim 1 wherein an outer wall of the generator is a finned cylinder, said outer wall being an outer surface of a liquid coolant jacket chamber, said coolant jacket chamber being the outer downward flowing leg of a convective coolant loop for the photovoltaic cell strings, said cell strings being mounted on individual coolant channels which together form the upward leg of said convective cooling loop.

7. The generator of claim 1 wherein a window is mounted in front of the cells to reduce heat transfer by hot air from the emitter, said window having been coated on its front side to reflect infrared radiation with wavelengths longer than 2 microns and transmit shorter useful wavelengths.

8. The thermophotovoltaic generator of claim 1, wherein said solid optical elements are attached to said cell strings to concentrate the infrared radiation from the emitter onto the cell strings by total internal reflection.

9. The thermophotovoltaic generator of claim 8 wherein said solid optical elements are coated on front faces nearest the emitter to reflect radiation with wavelengths longer than 2 microns back to the emitter while allowing shorter wavelengths to be transmitted through to the photovoltaic cells.

* * * * *